US007821316B2

(12) United States Patent
Fiedler

(10) Patent No.: US 7,821,316 B2
(45) Date of Patent: Oct. 26, 2010

(54) MULTIPHASE CLOCK GENERATOR WITH ENHANCED PHASE CONTROL

(75) Inventor: Alan S. Fiedler, Mountain View, CA (US)

(73) Assignee: Microsoft Corporation, Redmond, WA (US)

(*) Notice: Subject to any disclaimer, the term of this patent is extended or adjusted under 35 U.S.C. 154(b) by 64 days.

(21) Appl. No.: 12/342,857

(22) Filed: Dec. 23, 2008

(65) Prior Publication Data

US 2010/0052744 A1 Mar. 4, 2010

Related U.S. Application Data

(60) Provisional application No. 61/092,923, filed on Aug. 29, 2008.

(51) Int. Cl.
*H03H 11/16* (2006.01)
(52) U.S. Cl. ........................ 327/231; 327/158
(58) Field of Classification Search ........................ None
See application file for complete search history.

(56) References Cited

U.S. PATENT DOCUMENTS

| 5,063,579 | A | 11/1991 | Sasaki et al. |
| 5,396,523 | A | 3/1995 | Hedberg |
| 5,436,939 | A | 7/1995 | Co et al. |
| 5,781,055 | A | 7/1998 | Bhagwan |
| 6,137,328 | A | 10/2000 | Sung |
| 6,256,362 | B1 | 7/2001 | Goldman |
| 6,441,659 | B1 | 8/2002 | Demone |
| 6,441,667 | B1 | 8/2002 | Boerstler et al. |
| 6,480,049 | B2 | 11/2002 | Boerstler et al. |
| 6,633,190 | B1 | 10/2003 | Alvandpour et al. |
| 6,650,157 | B2 | 11/2003 | Amick et al. |
| 6,664,861 | B2 | 12/2003 | Murakami |
| 6,703,879 | B2 | 3/2004 | Okuda et al. |
| 6,717,887 | B1 | 4/2004 | Kono et al. |
| 6,741,110 | B2 * | 5/2004 | Roisen ........................ 327/158 |
| 6,943,599 | B2 | 9/2005 | Ngo |
| 7,009,441 | B2 | 3/2006 | Fiedler |
| 7,030,674 | B2 | 4/2006 | Johnson |
| 7,030,705 | B2 | 4/2006 | Kim |
| 7,054,374 | B1 | 5/2006 | Jensen |
| 7,068,086 | B2 | 6/2006 | Takeda |
| 7,088,158 | B2 | 8/2006 | Block |
| 7,116,746 | B2 | 10/2006 | Nagano |
| 7,221,723 | B2 | 5/2007 | Walker |
| 7,301,383 | B2 | 11/2007 | Suzuki |
| 7,330,059 | B2 * | 2/2008 | Tai et al. ...................... 327/158 |
| 7,400,181 | B2 * | 7/2008 | Metz et al. .................. 327/149 |
| 7,489,176 | B2 | 2/2009 | Kaviani et al. |

(Continued)

OTHER PUBLICATIONS

In the United States Patent and Trademark Office, in re.: U.S. Appl. No. 12/163,008, filed Jun. 27, 2008, Non-Final Office Action dated Sep. 1, 2009, 10 pages.

(Continued)

*Primary Examiner*—Cassandra Cox
(74) *Attorney, Agent, or Firm*—Woodcock Washburn LLP

(57) ABSTRACT

A multi-phase clock generator circuit receives an input clock signal and produces multiple output clock signal, each from a respective delay stage of a multi-stage voltage-controlled delay line (VCDL). The rising edges of the multiple output clock signals produced by the circuit are substantially equidistant in time from one another and have substantially equal phase spacing.

20 Claims, 11 Drawing Sheets

U.S. PATENT DOCUMENTS

| | | |
|---|---|---|
| 7,518,423 B2 | 4/2009 | Kumata |
| 2003/0210758 A1 | 11/2003 | Lee et al. |
| 2005/0040876 A1 | 2/2005 | Jeon |
| 2007/0098128 A1 | 5/2007 | Ishida et al. |

OTHER PUBLICATIONS

Eckerbert, D. et al., "A Mixed-Mode Delay-Locked-Loop Architecture", Proceedings of the 21st International Conference on Computer Design, 2003, 3 pages.

Liu, T-T. et al., "A 1-4 GHz DLL Based Low-Jitter Multi-Phase Clock Generator for Low-Band Ultra-Wideband Application", IEEE Asia-Pacific Conference on Advanced System Integrated Circuits (AP-ASIC), 2004, 330-333.

Wu, L. et al., "A Low-Jitter Skew-Calibrated Multi-Phase Clock Generator for Time-Interleaved Applications", IEEE International Solid State Circuits Conference, 2001, 25.3, 3 pages.

Daneshgaran, F. et al., "Transreceiver Front-End Technology for Software Radio Implementation of Wideband Satellite Communication Systems", Jul. 25, 2002, 29 pages, www.euroconcepts.it.

* cited by examiner

Multi-Phase Clock Generator Circuit

Multi-Phase Clock Generator Circuit

Voltage-Controlled Delay Element

Phase Measurement Circuit

Output Level Converter and Buffer

Duty Cycle Measurement Circuit

Input Level Converter and Duty Cycle Adjust Circuit

FIG. 7  Sampler Having Zero Setup/Hold Time Error

RS-Latch

Phase Detector

Low-Pass Filter

US 7,821,316 B2

MULTIPHASE CLOCK GENERATOR WITH ENHANCED PHASE CONTROL

CROSS-REFERENCE TO RELATED APPLICATIONS

This application is based on, and claims priority to, provisional application No. 61/092,923, filed Aug. 29, 2008, titled "Multiphase Clock Generator with Enhanced Phase Control," the entire contents of which are hereby incorporated by reference.

BACKGROUND

The generation and control of multiple clock signals operating at one frequency, having distributed phases, and having substantially equal phase spacing is critical to the design of many high-performance, high-speed chip-to-chip interconnect systems. Some interconnect systems use just two phases: the rising and falling edge of a single, very high-speed clock. However, accurately controlling the duty-cycle of such a high-speed clock may be difficult. Also, it becomes necessary (and also difficult) to operate the high speed clock at a high frequency equal to one-half the data rate. Other interconnect systems use 4, 5, 8, 10 or more clock phases in their transmitter, receiver, or both. Because there are more clock phases, these multi-phase clocks can operate at a lower frequency equal to a smaller fraction of the data rate, such as one-fourth, one-fifth, one-eighth, or one-tenth, for example. Many chip-to-chip interconnect systems make use of multi-phase clock generators because of the lower frequency of the clocks required to support a given data rate.

SUMMARY

A multi-phase clock generator circuit receives an input clock signal and produces multiple output clock signals, each from a respective delay stage of a multi-stage voltage-controlled delay line (VCDL). The rising edges of the multiple output clock signals produced by the circuit are substantially equidistant in time from one another and have substantially equal phase spacing. Each delay stage of the voltage controlled delay line includes a phase measurement circuit that receives the output clock signal produced by that delay stage and the output clock signal produced by the next delay stage of the voltage-controlled delay line and that produces therefrom a measure of the phase spacing between the two received output clock signals, first and second voltage-controlled current sources that receive the phase measurement from the phase measurement circuit and produce therefrom a control signal, and a voltage-controlled delay element having an input that receives either the input clock signal or a delayed clock signal from the previous delay stage and, in response to the control signal from the voltage-controlled current sources, imposes an insertion delay on the input clock signal or delayed clock signal to said delay stage to produce a delayed clock signal that is fed to the next delay stage of the delay line. The multi-phase clock generator circuit also comprises a phase detector that ensures that the total delay of the VCDL is substantially equal to the period of the input clock signal, and a low-pass filter coupled between and operating in combination with the phase detector, the phase measurement circuits, and the first and second voltage-controlled current sources, to provide stable control of the insertion delay of each delay stage of the VCDL such that each insertion delay is substantially equal to the others and the phase spacing between adjacent output clock signals of the different delay stages is thereby substantially uniform.

Other features of the multi-phase clock generator circuit will become evident from the following description and figures.

BRIEF DESCRIPTION OF THE DRAWINGS

The foregoing summary and the following detailed description are better understood when read in conjunction with the appended drawings. For the purpose of illustrating the multi-phase correction circuit, there is shown in the drawings exemplary embodiments of various aspects of the circuit; however, the invention is not limited to the specific circuitry, methods and instrumentalities disclosed. In the drawings.

DETAILED DESCRIPTION

A challenge of designing a multi-phase clock generator is to achieve both of the following: (1) good power supply rejection—the relative phase between the output clocks should not change when the power supply is modulated, and further, the relative phase between the input clock and the output clocks should also not change; and (2) good relative phase control over process and temperature—the phase spacing of the output clocks (45 degrees if 8 clocks, or 36 degrees if 10 clocks, for example) should not vary with changes in the process (e.g. slow corner vs. fast corner), individual transistor variation (i.e. device matching errors), and temperature. The extent to which the above is not achieved will degrade the timing margin of any interconnect system built with circuits which use multiple clock phases. To the extent that it is achieved, the interconnect system timing margin, manufacturing tolerances, and product robustness over life is enhanced.

Figure 1A:
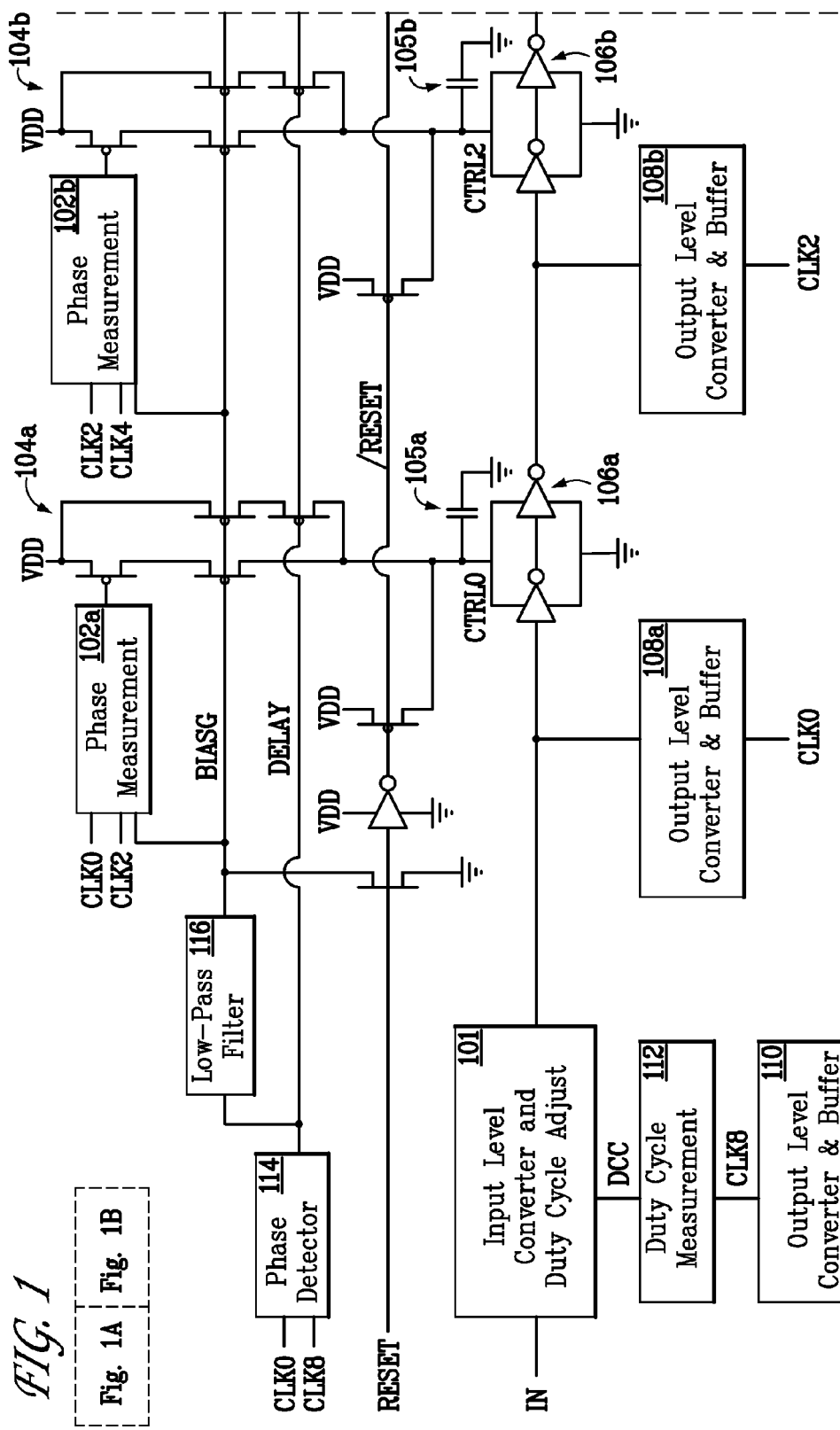
FIG. 1 illustrates one embodiment of a multi-phase clock generator circuit.
Figure 1B:
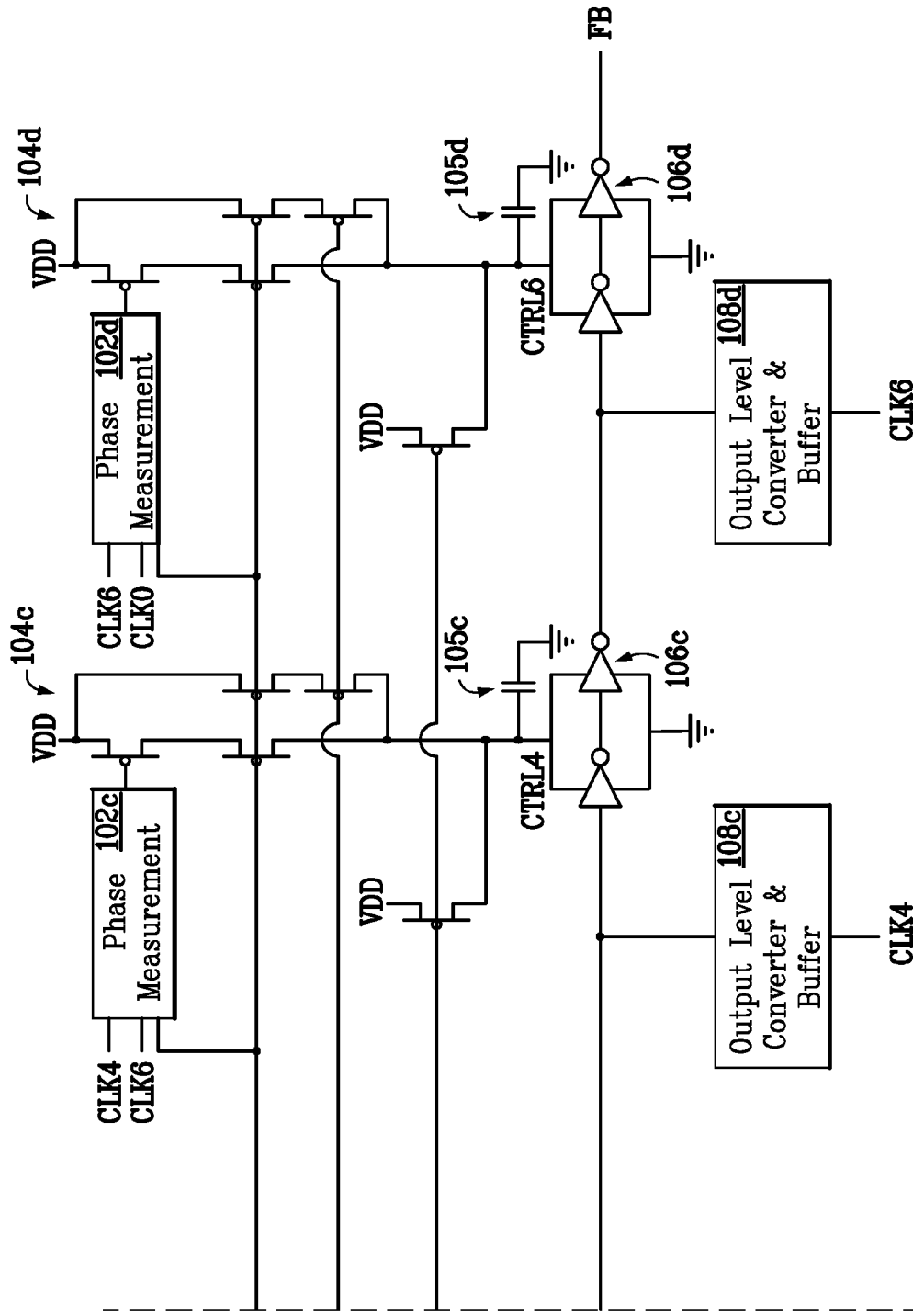

FIG. 1 is a diagram of one embodiment of a multi-phase clock generator circuit. As shown in this embodiment, the multi-phase clock generator circuit receives at input IN an input clock signal. That signal is fed to an input level converter and duty cycle adjust circuit 101, and the resulting conditioned input clock signal is then fed to a first delay stage of a voltage-controlled delay line (VCDL). In the present embodiment, the VCDL comprises four delay stages, however in other embodiments, the VCDL may comprise more or fewer delay stages as desired.

In the present embodiment, the multi-phase clock generator circuit produces four output clock signals CLK0, CLK2, CLK4 and CLK6, each from a respective one of the delay stages of the VCDL, as well as a last clock signal CLK8, generated from the output of the last delay stage of the VCDL. When the multi-phase clock generator circuit is in lock, the rising edge of CLK8 is coincident with the rising edge of CLK0. Additionally, the delay from the rising edge of each clock signal to the rising edge of the next clock signal, and the delay from the rising edge of the fourth clock signal to the rising edge of the first clock signal, are all substantially equal. That is, the rising edges of the four clock signals produced by the circuit are substantially equidistant in time from one another and have substantially equal phase spacing.

As further shown in FIG. 1, each delay stage of the voltage controlled delay line includes a voltage-controlled non-inverting delay element built from two cascaded inverters (106a, 106b, 106c and 106d), an output level-converter and buffer circuit (108a, 108b, 108c and 108d), a phase measurement circuit (102a, 102b, 102c and 102d), and first and second voltage-controlled current-sources (104a, 104b, 104c and 104d), each comprising 4 PFETs in this embodiment. Each delay stage also includes a respective filter capacitor (105a, 105b, 105c and 105d).

As further shown, the multi-phase clock generator circuit includes an additional output-level converter and buffer circuit 110 and a duty-cycle measurement circuit 112. The duty-cycle measurement circuit 112 measures the duty cycle of the last clock signal CLK8. A "DCC" output of the duty cycle measurement circuit 112 provides a control signal to the input level converter and duty cycle adjust circuit 101, as described more fully hereinafter.

The multi-phase clock generator circuit operates as follows. An input clock signal (at input terminal IN) is input to the input level converter and duty cycle adjust circuit 101. In the present embodiment, the output clock signal of the input level converter and duty cycle adjust circuit is conditioned and its duty cycle adjusted by circuit 101 so that the duty cycle of CLK8 is approximately fifty percent (50%). The conditioned output clock signal is then fed to the four-stage VCDL. The output level converter and buffer circuit 108a of the first delay stage of the VCDL produces the first clock signal CLK0, and the voltage-controlled non-inverting delay element 106a of the first delay stage produces a delayed clock signal that is then fed to the second delay stage of the delay line, and so on. The delay imposed by each delay element 106a, 106b, 106c, 106d is continuously controlled in order to maintain the desired equal spacing between the rising edges of the successive output clock signals. Specifically, the phase measurement circuit in each delay stage (102a, 102b, 102c, 102d) measures the spacing between the rising edge of its respective output clock signal and the immediately succeeding output clock signal and produces, in combination with the respective voltage-controlled current sources (104a, 104b, 104c, 104d), a respective control voltage (CTRL0, CTRL2, CTRL4, CTRL6) that is then input to the respective delay element (106a, 106b, 106c, 106d) of that delay stage to correct the timing of the rising edge of its buffered output clock signal as necessary. For example, the first phase measurement circuit 102a receives the output clock signal CLK0 of its respective delay stage as well as the clock signal CLK2 of its immediately succeeding delay stage. The resulting phase measurement is then used, in combination with the four PFETs that comprise the respective voltage-controlled current source, to produce output voltage CTRL0, which is fed to the power supply input of the first voltage-controlled delay element 106a to control the timing between the rising edge of CLK2 relative to CLK0. This control is repeated in each delay stage of the delay line such that the rising edges of the output clock signals are substantially equidistant in time from one another and have substantially equal phase spacing.

As further shown in FIG. 1, the multi-phase clock generator circuit further comprises a phase detector 114 that ensures that the total delay of the VCDL is substantially equal to the period of the input clock signal, and a low-pass filter 116 coupled between and operating in combination with the phase detector, the phase measurement circuits (102a-d), and the voltage-controlled current sources (104a-d) to provide stable control of the insertion delay of each delay stage of the VCDL such that each insertion delay is substantially equal to the others and the phase spacing between adjacent output clock signals of the different delay stages is thereby substantially uniform.

Figure 2:
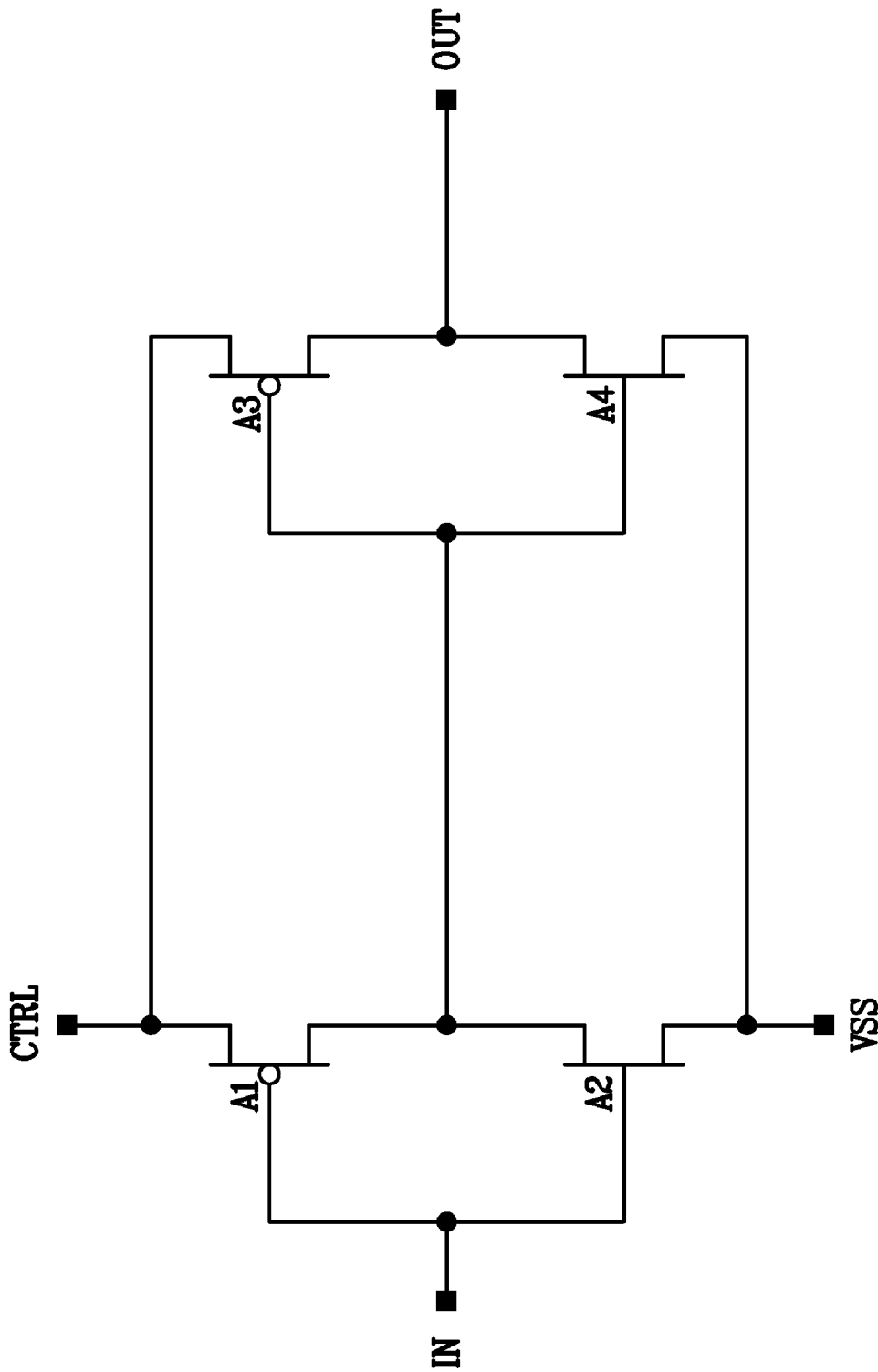
FIG. 2 illustrates details of one embodiment of a voltage-controlled delay element of the multi-phase clock generator circuit of FIG. 1.

FIG. 2 illustrates details of one embodiment of a voltage-controlled non-inverting delay element that can be used to implement each of the delay elements 106a, 106b, 106c and 106d of the multi-phase clock generator of FIG. 1. As shown, the delay element receives the controlled power supply voltage CTRL produced by the respective phase measurement circuit and voltage-controlled current sources of its respective delay stage of the VCDL, thereby controlling the amount of delay imposed by the element. The delay element receives at one input IN the output signal from the previous delay element of the delay line and produces at one output OUT a delayed clock signal which is then input to the next delay element in the delay line.

In greater detail, the delay element comprises a first p-type transistor A1 having a source coupled to CTRL, a gate coupled to IN, and a drain coupled to an intermediate node. A second n-type transistor A2 has its source coupled to VSS, a gate coupled to IN, and a drain coupled to the intermediate node. A third p-type transistor A3 has its source coupled to CTRL, a gate coupled to the intermediate node, and a drain coupled to OUT. Finally, a fourth n-type transistor A4 has its source coupled to VSS, a gate coupled to the intermediate node, and a drain coupled to OUT. As mentioned above, the insertion delay of the voltage-controlled delay element is controlled by the voltage at CTRL.

Figure 3:
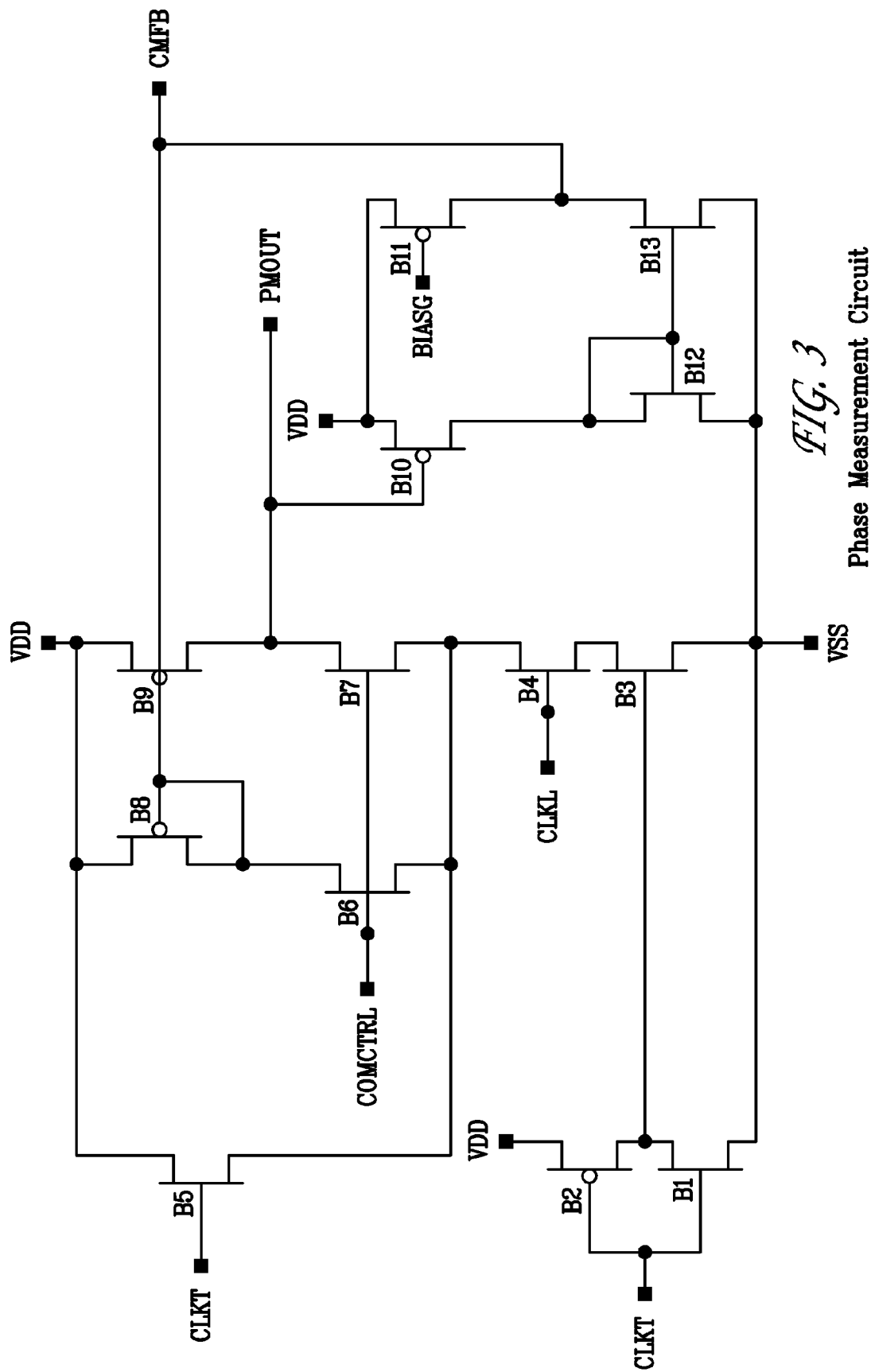
FIG. 3 illustrates details of one embodiment of a phase measurement circuit of the multi-phase clock generator of FIG. 1.

FIG. 3 illustrates details of one embodiment of a phase measurement circuit that can be used to implement each of the phase measurement circuits (102a-d) of the multi-phase clock generator of FIG. 1. As mentioned above, the phase measurement circuit of a given delay stage provides a measure of the phase difference between two adjacent clock signals that is then used in the control of a power supply voltage to the respective delay element of that delay stage. There are two means of controlling the power supply voltage to a given delay element, and they operate at the same time. The first means includes a switched power supply current to the delay element, with the switch position dependent on whether the last clock phase leads or lags the first clock phase. This first means helps with control loop stability. The second means includes a current controlled by the clock phase measurement produced by an instance of the phase measurement circuit of FIG. 3, and by a second voltage BIASG. The currents provided by these two means are summed and integrated by a respective filter capacitor of the delay stage (105a-d of FIG. 1).

In greater detail, the phase measurement circuit comprises, in one embodiment, a phase measurement output signal node PMOUT. A first n-type transistor B1 has its source coupled to VSS, a gate coupled to receive the output clock signal CLKT of the next delay stage of the delay line, and a drain coupled to a first internal node. A second p-type transistor B2 has its source coupled to VDD, a gate coupled to CLKT, and a drain coupled to the first internal node. A third n-type transistor B3 has its source coupled to VSS, a gate coupled to the first internal node, and a drain coupled to a second internal node. A fourth n-type transistor B4 has a source coupled to the second internal node, a gate coupled to receive the output clock signal (CLKL) of its own delay stage of the VCDL, and a drain coupled to a third internal node. A fifth n-type transistor B5 has a source coupled to the third internal node, a gate coupled to CLKT, and a drain coupled to VDD. A sixth n-type transistor B6 has a source coupled to the third internal node, a gate coupled to a common control signal COMCTRL, and a drain coupled to a common mode feedback signal CMFB. A seventh n-type transistor B7 has a source coupled to the third internal node, a gate coupled to COMCTRL, and a drain coupled to PMOUT. An eighth p-type transistor has a source coupled to VDD, and a gate and drain coupled to CMFB. A ninth p-type ninth transistor B9 has a source coupled to VDD, a gate coupled to CMFB, and a drain coupled to PMOUT. A tenth p-type transistor B10 has a source coupled to VDD, a gate coupled to PMOUT, and a drain coupled to a fourth internal node. An eleventh p-type transistor B11 has a source coupled to VDD, a gate coupled to a bias signal BIASG output from the low-pass filter 116 of the multiphase clock generator circuit of FIG. 1, and a drain coupled to CMFB. A twelfth n-type transistor has a source coupled to VSS, and a gate and drain coupled to the fourth internal node. Finally, a thirteenth n-type transistor has a source coupled to VSS, a gate coupled to the fourth internal node, and a drain coupled to CMFB.

Figure 4:
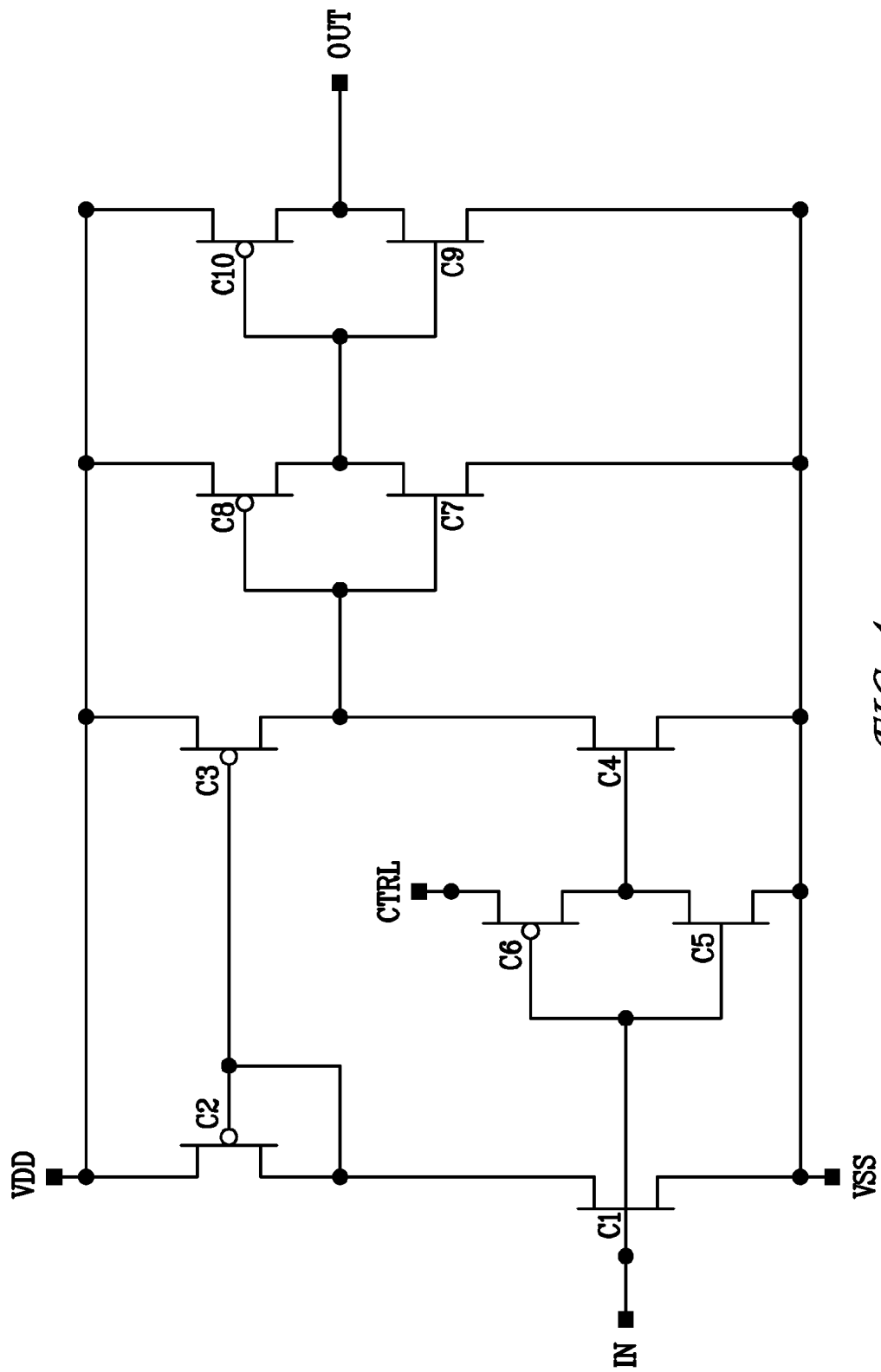
FIG. 4 illustrates details of one embodiment of an output level converter and buffer of the multi-phase clock generator of FIG. 1.

FIG. 4 illustrates details of one embodiment of an output level converter and buffer circuit that can be used to implement each of the output level converter and buffer circuits 108a-d and 110 of FIG. 1. As shown, the circuit comprises an input terminal IN that receives the non-buffered output clock signal for the stage, and an output terminal OUT on which the output clock signal of the stage is output. A power supply terminal CTRL is coupled to CTRL0 for circuit instance 108a, to CTRL2 for circuit instance 108b, to CTRL4 for circuit instance 108c, to CTRL6 for circuit instance 108d, and to CTRL0 for circuit instance 110. The circuit further includes power supply terminals VSS and VDD. A first n-type transistor C1 has a source coupled to VSS, a gate coupled to IN, and a drain coupled to a first internal node. Second and third p-type transistors C2 and C3 form a current mirror, with C2 having a source coupled to VDD, and a gate and drain coupled to the first internal node, and C3 having a source couple to VDD, a gate coupled to the first internal node, and a drain coupled to a second internal node. A fourth n-type transistor C4 has a source coupled to VSS, a gate coupled to a third internal node, and a drain coupled to the second internal node, and a fifth n-type transistor C5 has a source coupled to VSS, a gate coupled to IN, and a drain coupled to the third internal node. A sixth p-type transistor C6 has a source coupled to CTRL, a gate coupled to IN, and a drain coupled to the third internal node. A seventh n-type transistor C7 has a source coupled to VSS, a gate coupled to the second internal node, and a drain coupled to a fourth internal node. An eighth p-type transistor has a source coupled to VDD, a gate coupled to the second internal node, and a drain coupled to the fourth internal node. A ninth n-type transistor has a source coupled to VSS, a gate coupled to the fourth internal node, and a drain coupled to OUT. Finally, a tenth p-type transistor has a source coupled to VDD, a gate coupled to the fourth internal node, and a drain coupled to OUT.

In operation, transistors C1-C6 work together to convert the reduced signal swing on IN (switching between VSS and CTRL) to a rail-to-rail signal swing on the second internal node (switching between VSS and VDD), as well as ensure that the rise time and fall time of the signal on the second internal node are substantially equal, thereby minimizing duty cycle distortion. Transistors C7-C10 form two series inverters used to buffer the clock signal and increase the output drive strength of the circuit.

Figure 5:
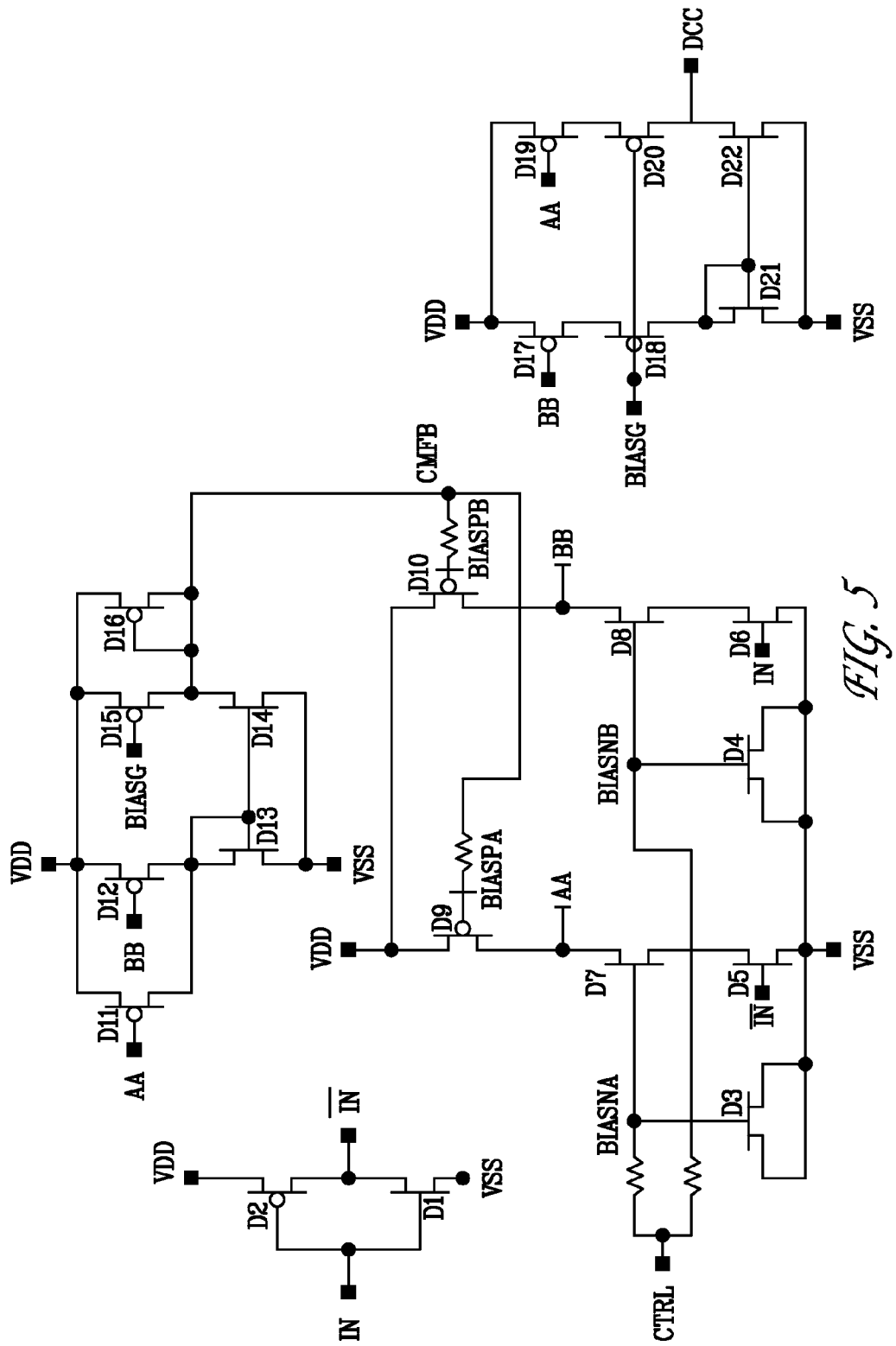
FIG. 5 illustrates details of one embodiment of a duty-cycle management circuit of the multi-phase clock generator of FIG. 1.

FIG. 5 illustrates details of one embodiment of a duty cycle measurement circuit that can be used to implement the duty cycle measurement circuit 112 of FIG. 1. As shown in FIG. 5, the duty cycle measurement circuit comprises an inverter (comprising transistors D1-D2), a bandwidth-controlled amplifier stage (comprising transistors D3-D10), a common-mode control circuit (comprising transistors D11-D16), and a bandwidth-controlled differential to single-ended converter (comprising transistors D17-D22). The circuit receives the clock signal CLK8 of the last delay stage of the VCDL (as converted and buffered by circuit 110 of FIG. 1) at input IN and outputs a respective duty-cycle control signal on line DCC. In one embodiment, it may be desirable to control duty cycle to 50% because this may ensure that the falling edges of the output clock signals CLK0, CLK2, CLK 4 and CLK6 are equally spaced, in addition to their rising edges. The duty-cycle control signal DCC is then fed to the input level converter and duty-cycle adjustment circuit 101 of FIG. 1.

In greater detail, by means of transistor switches D5 and D6, common-gate, bandwidth-controlling transistors D7 and D8, and pull-up current source transistors D9 and D10, the amplifier stage converts the duty cycle of the input signal IN to differential signals AA and BB whose average difference in voltage is proportional to a deviation from 50% of the input signal's duty cycle. To control a common-mode voltage of AA and BB, a gate bias of D9 and D10 is controlled by the common-mode control circuit such that the average voltage of AA and BB is nominally equal to the voltage at BIASG. Diode-connected transistor D16 is included to reduce the gain and improve stability of the common-mode feedback. The differential to single ended converter converts the differential signals AA and BB to a singled-ended duty cycle control signal DCC and includes common-source transistors D17 and D19, common-gate, bandwidth-controlling transistors D18 and D20, and current-mirror transistors D21 and D22.

Figure 6:
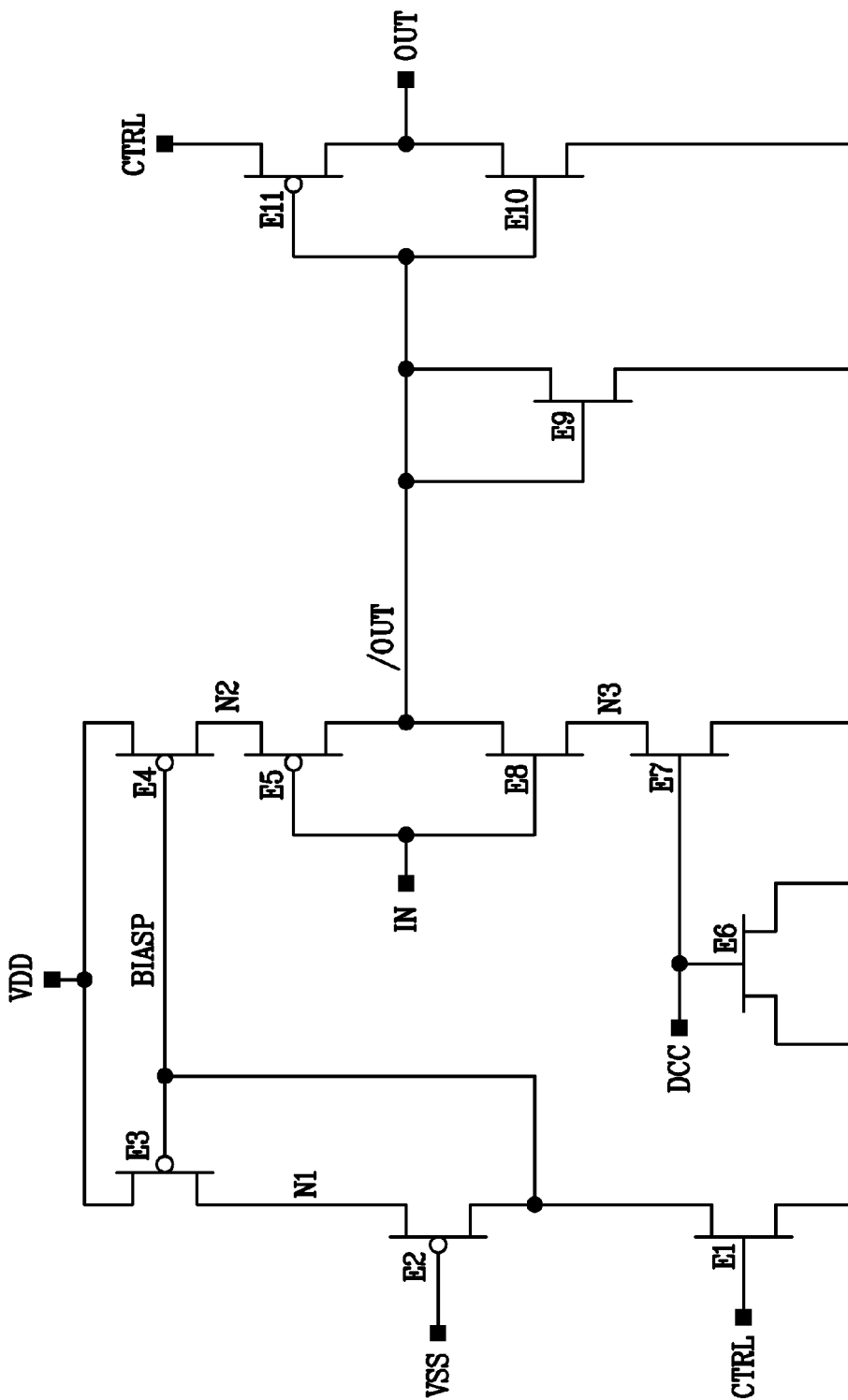
FIG. 6 illustrates details of one embodiment of an input level converter and duty cycle adjust circuit of the multi-phase clock generator of FIG. 1.

FIG. 6 illustrates details of one embodiment of the input level converter and duty cycle adjustment circuit that can be used to implement the circuit 101 of FIG. 1. As shown, the circuit receives at its input IN the input clock signal, and then performs level conversion, duty cycle adjustment and buffering to provide a conditioned clock signal that is fed to the delay element 106a and output level converter and buffer 108a of the first delay stage of the VCDL. The duty-cycle adjustment circuit receives the duty-cycle control signal DCC from the duty cycle measurement circuit 112 (FIG. 5). In operation, the duty-cycle control signal DCC controls the falling transition time of the signal at internal node /OUT and, by the action of the inverter formed by transistors E10 and E11, controls the position of the rising edge of the signal at the output terminal OUT relative to its falling edges, thereby controlling its duty cycle.

In addition to the terminals IN, OUT and DCC, the circuit includes power supply terminals VSS and VDD and a third power supply terminal CTRL which is coupled to the CTRL power supply terminal of the VCDL's first delay element.

Current-source transistor E1 supplies a pull-down current to current mirror transistors E2-E4, which in turn source a pull-up current to transistor switch E5. Transistor E7 is a current source which sinks a pull-down current from transistor switch E8. When the voltage at CTRL equals the voltage at DCC, pull-up and pull-down currents through E5 and E8, respectively, will be substantially equal, as will be rise and fall times at /OUT. This will lead to little or no duty cycle distortion from IN to /OUT. By then adjusting the voltage at DCC above or below the voltage at CTRL, and in combination with the duty-cycle measurement circuit, duty cycle is controlled at nominally 50%. Diode-connected transistor E9 controls the high voltage at /OUT to be nominally equal to the voltage at CTRL and independent of VDD, improving power supply rejection.

Figure 7:
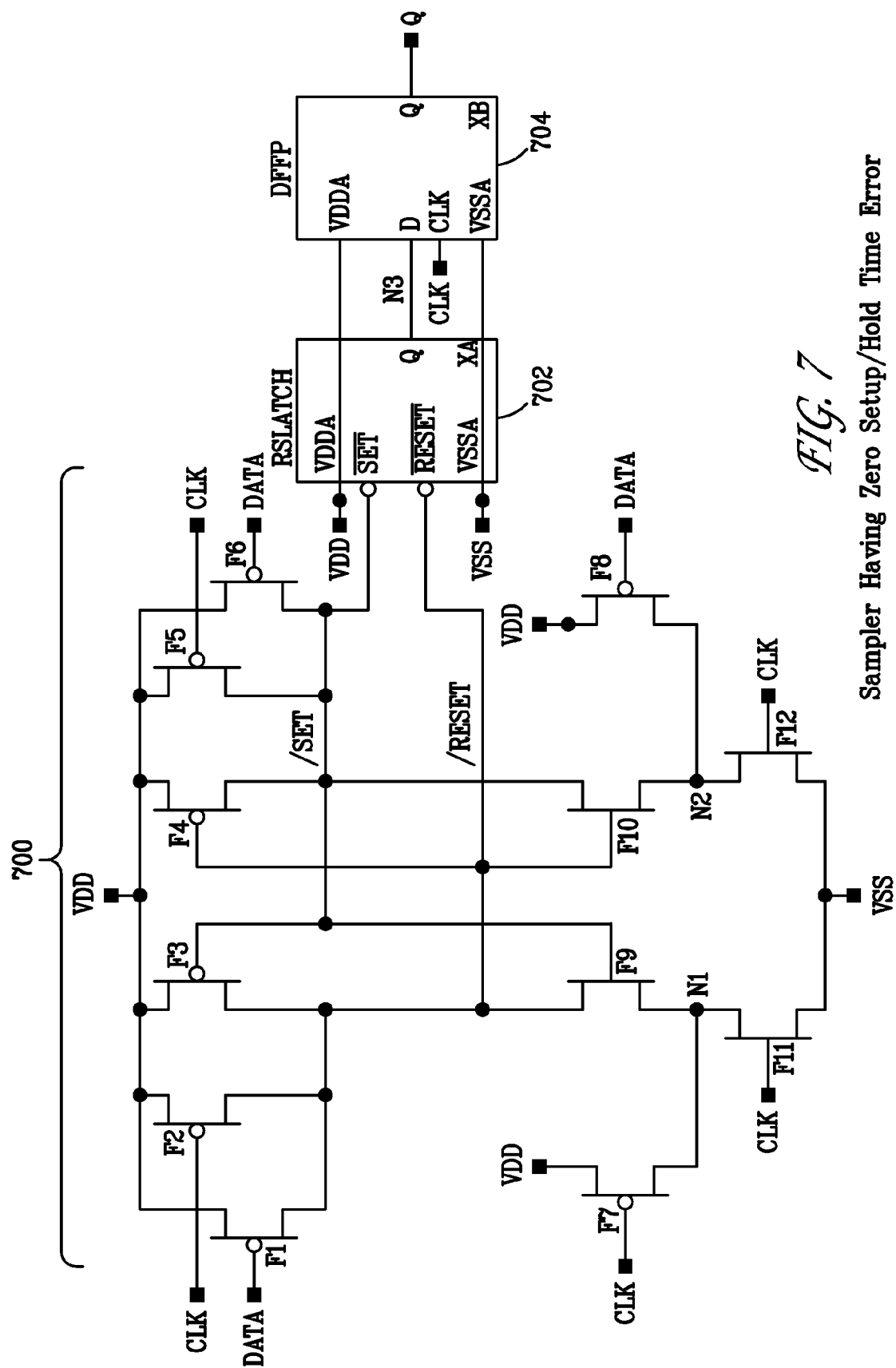
FIG. 7 illustrates details of one embodiment of a sampler circuit having zero setup/hold time error for use in the phase detector circuit of FIG. 1.
Figure 8:
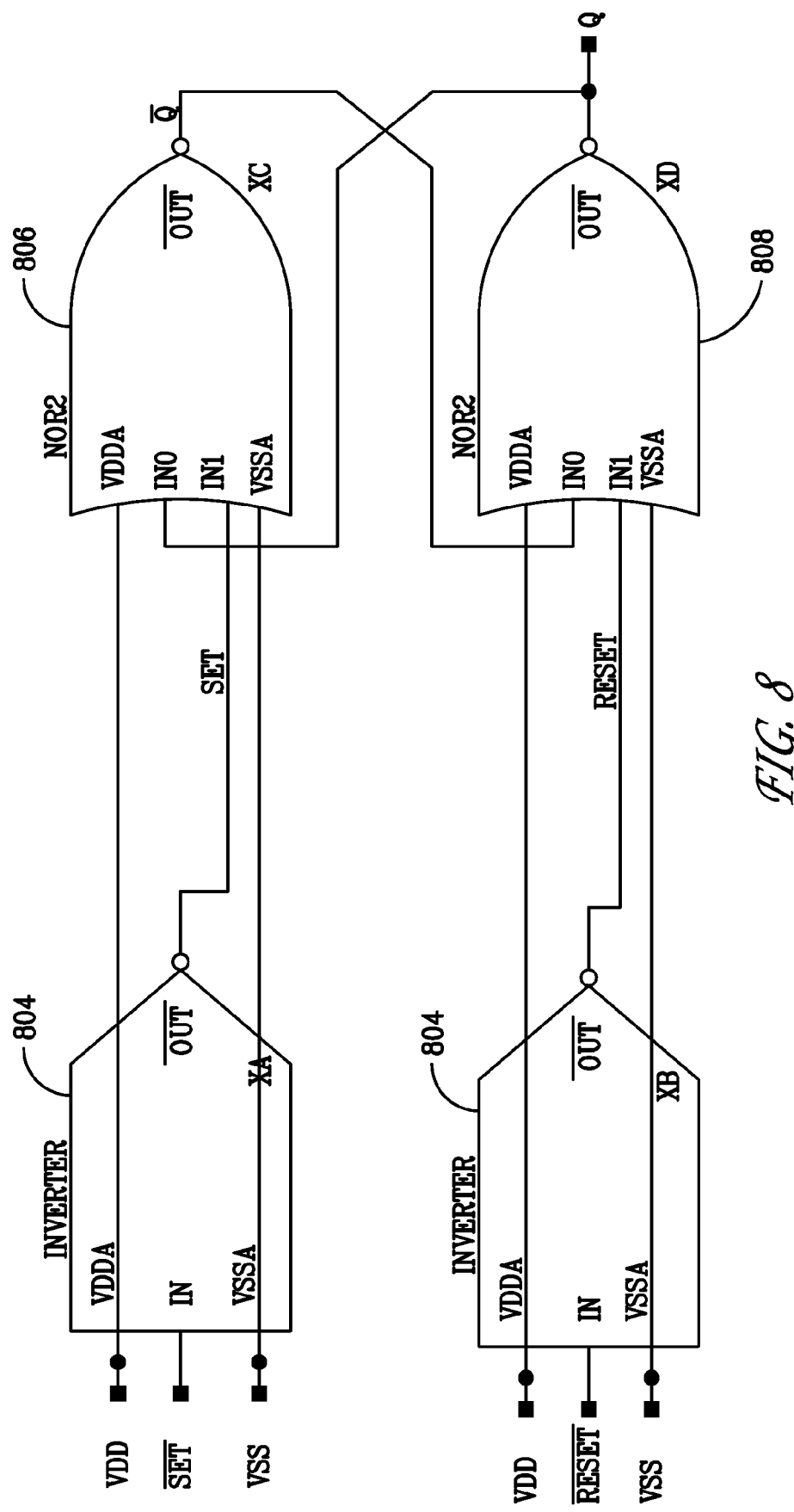
FIG. 8 illustrates details of one embodiment of an RS-latch circuit for use in the sampler circuit of FIG. 7.

FIG. 7 illustrates one embodiment of a sampler circuit having substantially zero systematic setup/hold time error for use in the phase detector. A balanced sampling amplifier 700 comprising transistors F1-F12 is controlled by CLK and DATA such that if a rising edge of CLK leads a rising edge of DATA, a result will be that internal node /RESET will go low and internal node /SET will remain high. Similarly, if a rising edge of CLK trails a rising edge of DATA, the result will be that /SET will go low and /RESET will remain high. RS-latch 702 (FIG. 8) and D-type flip-flop 704 then transfer this result to sampler circuit output Q on the next rising edge of CLK.

Figure 9:
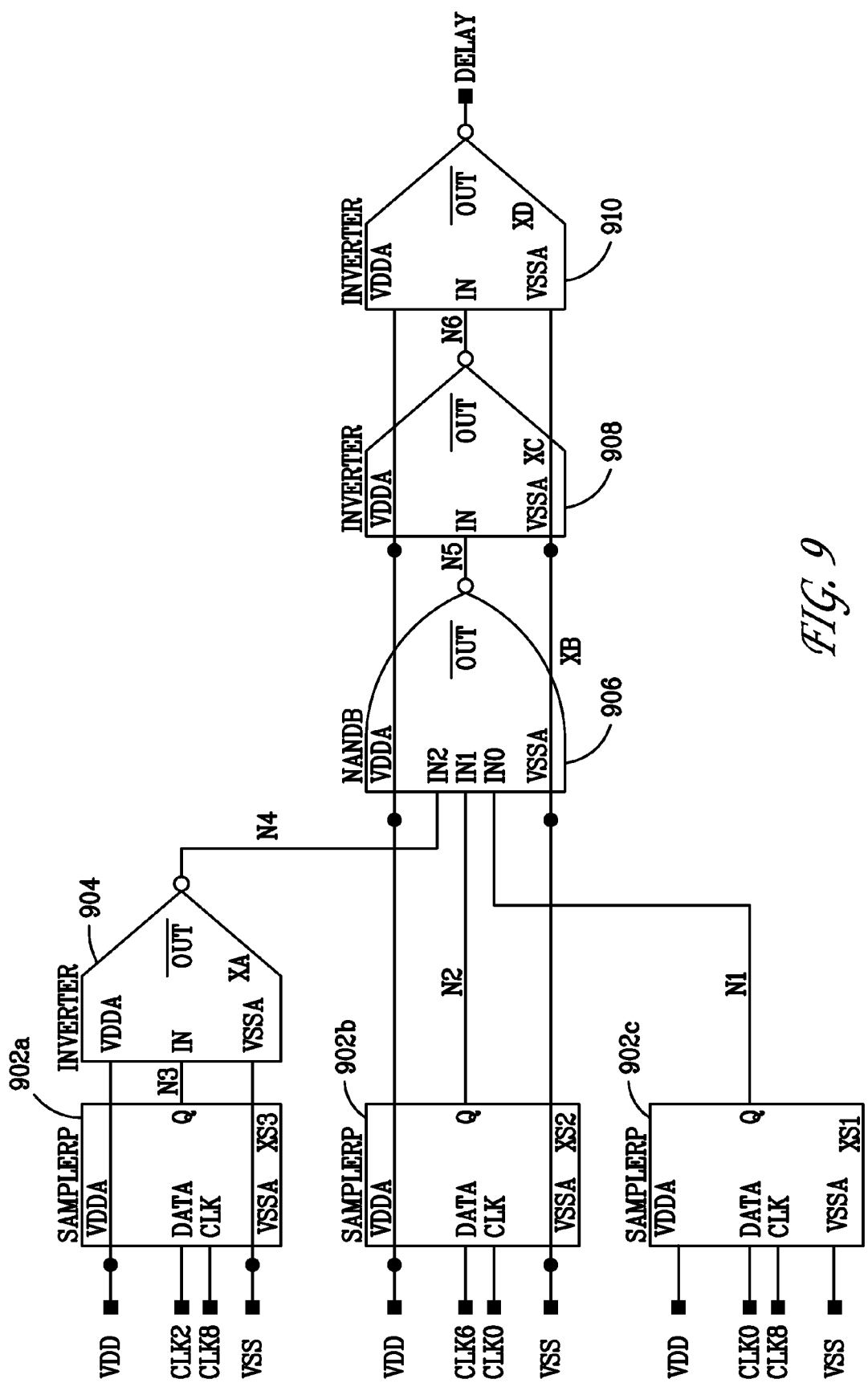
FIG. 9 illustrates further details of one embodiment of the phase detector circuit.

FIG. 9 illustrates further details of one embodiment of a phase detector that can be used to implement phase detector 114 of FIG. 1. With reference to FIG. 1, the phase detector of the multi-phase clock generator circuit receives as inputs the output clock signal CLK0 of the first delay stage of the VCDL as well as a clock signal CLK8 produced by the output level and buffer circuit 110 from the delayed clock output FB of the delay element 106d of the last delay stage of the VCDL. Additionally, and so as to assist in the operation of the phase detector prior to when and as the clock generator comes into lock, the phase detector receives intermediate output clock signals CLK2, which trails CLK0 by 45 degrees, and CLK6, which leads CLK8 by 45 degrees. As shown in FIG. 9, clock signals CLK2 and CLK8 are input to the DATA and CLK terminals, respectively, of one instance 902a of the sampler circuit of FIG. 7. Clock signals CLK6 and CLK0 are input to the DATA and CLK terminals, respectively, of a second instance 902b of the sampler circuit, and clock signals CLK0 and CLK8 are input to the DATA and CLK terminals, respectively, of a third instance 902c of the sampler circuit. The output of the first instance 902a of the sampler circuit is inverted (at 904) and is then fed to one input of a 3-input NAND gate 906. The other two inputs of the NAND gate receive the output of the other two instances 902b and 902c of the sampler circuit, respectively. The output of NAND gate 906 is then passed through two inverters, 908 and 910, and the output of second inverter 910 defines the DELAY output of the phase detector (see FIG. 1). By action of a delay-locked loop comprising the phase detector, the VCDL, and other described components, the multi-phase clock generator will reach a state of lock such that the rising edge of CLK0 will be substantially coincident with the rising edge of CLK8, internal signals N2 and N4 of the phase detector will be at a logic high, and internal signal N1 and output DELAY of the phase detector will intermittently switch between a logic low level and a logic high level such that lock is maintained.

Figure 10:
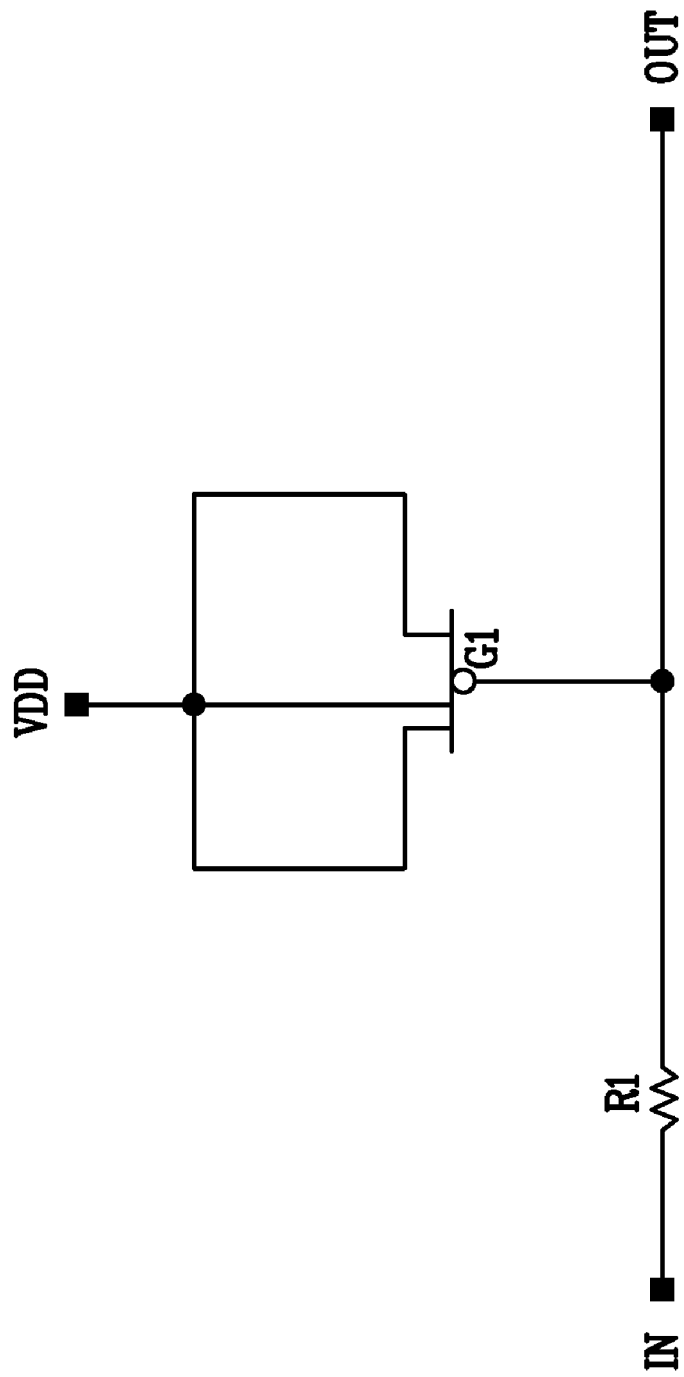
FIG. 10 illustrates details of a low-pass filter of the multi-phase clock generator of FIG. 1.

Related to the phase detector is a low-pass filter, illustrated in FIG. 10, which filters the DELAY signal so as to generate the BIASG bias voltage. In combination with the DELAY signal and signals from the phase measurements circuits (102a-d) of FIG. 1, BIASG aids in the control of the current supplied from current sources (104a-d), thereby controlling the delay of voltage-controlled delay elements (106a-d) of FIG. 1 such that lock is maintained.

While circuitry has been described above and illustrated with reference to specific embodiments, those skilled in the art will recognize that modifications and variations may be made without departing from the principles described above and set forth in the following claims. For example, although in the embodiments described above, four clock signals are generated, the circuitry disclosed above may be scaled to generate fewer or more clock signals. Accordingly, reference should be made to the following claims as describing the scope of the present invention.

What is claimed:

1. A multi-phase clock generator circuit, comprising:
    a clock input terminal that receives a clock input signal;
    at least two clock output terminals, each providing a clock output signal where the clock output signals collectively have substantially equal phase spacing;
    a voltage-controlled delay line (VCDL) comprising multiple delay stages, each delay stage of the voltage-controlled delay line comprising:
    an input terminal (IN);
    a first output terminal (OUT);
    a second output terminal (CLKOUT);
    a first control terminal (BIASG);
    a second control terminal (DELAY);
    a leading clock input terminal (CLKL);
    a trailing clock input terminal (CLKT);
    a delay control terminal (CTRL);
    a common delay control terminal (COMCTRL);
    a common-mode feedback terminal (CMFB);
    a voltage-controlled delay element having an insertion delay controlled by a voltage;
    an output level converter and buffer;
    a phase measurement circuit;
    a first voltage-controlled current-source;
    a second voltage-controlled current-source; and
    a filter capacitor;
    an input clock signal conditioning circuit;
    a phase detector; and
    a low-pass filter coupled between and operating in combination with the phase detector, the phase measurement circuits, and the first and second voltage-controlled current sources, to provide stable control of the insertion delay of each delay stage of the VCDL such that each insertion delay is substantially equal to the others and the phase spacing between adjacent output clock signals of the different delay stages is thereby substantially uniform.

2. The multi-phase clock generator circuit of claim 1, wherein the voltage-controlled delay element of each delay stage of the (VCDL) comprises:
    an input terminal (IN);
    an output terminal (OUT);
    a first power supply terminal (VSS);
    a second power supply terminal (CTRL) that receives the control signal from the voltage-controlled current sources;
    a p-type first transistor having a source coupled to (CTRL), a gate coupled to (IN), and a drain coupled to an intermediate node;
    an n-type second transistor having a source coupled to (VSS), a gate coupled to (IN), and a drain coupled to the intermediate node;

a p-type third transistor having a source coupled to (CTRL), a gate coupled to the intermediate node, and a drain coupled to (OUT); and an n-type fourth transistor having a source coupled to (VSS), a gate coupled to the intermediate node, and a drain coupled to (OUT), wherein the insertion delay of the voltage-controlled delay element is controlled by a voltage at (CTRL).

3. The multi-phase clock generator circuit of claim 2, wherein the phase measurement circuit of each delay stage of the (VCDL) comprises:

a phase measurement output signal node (PMOUT);

an n-type first transistor having a source coupled to (VSS), a gate coupled to receive the output clock signal (CLKT) of said delay stage, and a drain coupled a first internal node;

a p-type second transistor having a source coupled to (VDD), a gate coupled to (CLKT), and a drain coupled to the first internal node;

an n-type third transistor having a source coupled to (VSS), a gate coupled to the first internal node, and a drain coupled to a second internal node;

an n-type fourth transistor having a source coupled to the second internal node, a gate coupled to receive the output clock signal (CLKL) of the next delay stage of the (VCDL), and a drain coupled a third internal node;

an n-type fifth transistor having a source coupled to the third internal node, a gate coupled to (CLKT), and a drain coupled to (VDD);

an n-type sixth transistor having a source coupled to the third internal node, a gate coupled to (COMCTRL), and a drain coupled to (CMFB);

an n-type seventh transistor having a source coupled to the third internal node, a gate coupled to (COMCTRL), and a drain coupled to (PMOUT);

a p-type eighth transistor having a source coupled to (VDD), and a gate and drain coupled to (CMFB);

a p-type ninth transistor having a source coupled to (VDD), a gate coupled to (CMFB), and a drain coupled to (PMOUT);

a p-type tenth transistor having a source coupled to (VDD), a gate coupled to (PMOUT), and a drain coupled to a fourth internal node;

a p-type eleventh transistor having a source coupled to (VDD), a gate coupled to a bias signal (BIASG) output from the low-pass filter of the multiphase clock generator circuit, and a drain coupled to (CMFB);

an n-type twelfth transistor having a source coupled to (VSS), and a gate and drain coupled to the fourth internal node; and an n-type thirteenth transistor having a source coupled to (VSS), a gate coupled to the fourth internal node, and a drain coupled to (CMFB).

4. The multi-phase clock generator circuit of claim 3, wherein the first voltage-controlled current-source of each delay stage of the (VCDL) comprises:

a p-type first transistor having a gate coupled to the output terminal (PMOUT) of the phase measurement circuit, a source coupled to (VDD), and a drain coupled to a first internal node; and a p-type second transistor having a gate coupled to the output terminal (BIASG) of the low-pass filter, a source coupled to the first internal node, and a drain coupled to the (CTRL) terminal of the delay stage.

5. The multi-phase clock generator circuit of claim 4, wherein the second voltage-controlled current-source of each delay stage of the (VCDL) comprises:

a p-type first transistor having a gate coupled to the output terminal (BIASG) of the low-pass filter, a source coupled to (VDD), and a drain coupled to a second internal node; and a p-type second transistor having a gate coupled to an output terminal (DELAY) of the phase detector, a source coupled to the second internal node, and a drain coupled to the (CTRL) terminal of the delay stage.

6. The multi-phase clock generator circuit of claim 5, wherein each delay stage of the (VCDL) further comprises a filter capacitor comprising a thick-oxide transistor having a gate coupled to the (CTRL) terminal of the delay stage, and a source and drain coupled to (VSS).

7. The multi-phase clock generator circuit of claim 6, further comprising an input clock signal conditioning circuit that conditions the input clock signal before providing it to the first delay stage of the (VCDL), the input clock signal conditioning circuit comprises:

a clock input terminal (IN) that receives the input clock signal;

a clock output terminal (OUT) having an output clock signal that is fed to the first delay stage of the (VCDL);

a feedback clock input terminal (FB) that receives a feedback clock signal that is the output of the voltage-controlled delay element of the last delay stage of the (VCDL);

an internal node (DCC) having a duty cycle control voltage;

a clock signal (CLK8);

an output level converter and buffer having an input terminal coupled to (FB) and an output terminal coupled to (CLK8);

a duty-cycle measurement circuit having an input terminal coupled to (CLK8) and an output terminal coupled to internal node (DCC), and that outputs a duty cycle control voltage in proportion to the duty cycle of the feedback clock signal; and an input level converter and duty-cycle adjust circuit having an input terminal coupled to the clock input terminal (IN), an output terminal coupled to the clock output terminal (OUT), and a duty cycle control input terminal coupled to internal node (DCC), which generates the output clock signal as a level-shifted and duty-cycle adjusted version of the input clock signal in accordance with the duty cycle control voltage.

8. The multi-phase clock generator circuit of claim 7, wherein each delay stage of the (VCDL) further comprises an output level converter and buffer comprising:

the input terminal (IN);

the output terminal (OUT);

power supply terminals (VSS) and (VDD);

a third power supply terminal (CTRL);

an n-type first transistor having a source coupled to (VSS), a gate coupled to (IN), and a drain coupled to a first internal node;

a p-type second transistor having a source coupled to (VDD), and a gate and drain coupled to the first internal node;

a p-type third transistor having a source couple to (VDD), a gate coupled to the first internal node, and a drain coupled to a second internal node;

an n-type fourth transistor having a source coupled to (VSS), a gate coupled to a third internal node, and a drain coupled to the second internal node;

an n-type fifth transistor having a source coupled to (VSS), a gate coupled to (IN), and a drain coupled to the third internal node;

a p-type sixth transistor having a source coupled to (CTRL), a gate coupled to (IN), and a drain coupled to the third internal node;

an n-type seventh transistor having a source coupled to (VSS), a gate coupled to the second internal node, and a drain coupled to a fourth internal node;

a p-type eighth transistor having a source coupled to (VDD), a gate coupled to the second internal node, and a drain coupled to the fourth internal node;

an n-type ninth transistor having a source coupled to (VSS), a gate coupled to the fourth internal node, and a drain coupled to (OUT);

a p-type tenth transistor having a source coupled to (VDD), a gate coupled to the fourth internal node, and a drain coupled to (OUT).

9. The multi-phase clock generator circuit of claim 7, wherein the duty-cycle measurement circuit of the input clock signal conditioning circuit comprises:

the input terminal (IN);
a first bias terminal (CTRL);
a second bias terminal (BIASG);
a common-mode feedback terminal (CMFB);
the output terminal (DCC);
power supply terminals (VSS) and (VDD);
an n-type first transistor having a source coupled to (VSS), a gate coupled to (IN), and a drain coupled to an internal node (/IN);
a p-type second transistor having a source coupled to (VDD), a gate coupled to (IN), and a drain coupled to (/IN);
a first resistor coupled between (CTRL) and a first bias node (BIASNA);
a second resistor coupled between (CTRL) and a second bias node (BIASNB);
an n-type third transistor having a gate coupled to (BIASNA), and a source and drain coupled to (VSS);
an n-type fourth transistor having a gate coupled to (BIASNB), and a source and drain coupled to (VSS);
an n-type fifth transistor having a source coupled to (VSS), a gate coupled to (/IN), and a drain coupled to an internal node (SWAA);
an n-type sixth transistor having a source coupled to (VSS), a gate coupled to (IN), and a drain coupled to an internal node (SWBB);
an n-type seventh transistor having a source coupled to (SWAA), a gate coupled to (BIASNA) and a drain coupled to an internal node (AA);
an n-type eighth transistor having a source coupled to (SWBB), a gate coupled to (BIASNB), and a drain coupled to an internal node (BB);
a p-type ninth transistor having a source coupled to (VDD), a gate coupled to an internal node (BIASPA), and a drain coupled to (AA);
a p-type tenth transistor having a source coupled to (VDD), a gate coupled to internal node (BIASPB), and a drain coupled to (BB);
a third resistor coupled between (BIASPA) and (CMFB);
a fourth resistor coupled between (BIASPB) and (CMFB);
transistors to adjust a common-mode voltage of signals on internal nodes (AA) and (BB) such that their average voltage is substantially equal to a voltage on terminal (BIASG), for the purposes of controlling an open-loop frequency response of the duty cycle control loop; and
transistors to amplify a voltage difference of signals on internal nodes (AA) and (BB) and generate a voltage on (DCC) proportional to the voltage difference.

10. The multi-phase clock generator circuit of claim 9, wherein the transistors to adjust a common-mode voltage of signals on internal nodes (AA) and (BB) such that their average voltage is substantially equal to a voltage on second bias terminal (BIASG) comprise:

a p-type eleventh transistor having a source coupled to (VDD), a gate coupled to (AA), and a drain coupled to an internal node (N1);
a p-type twelfth transistor having a source coupled to (VDD), a gate coupled to (BB), and a drain coupled to internal node (N1);
an n-type thirteenth transistor having a source coupled to (VSS), and a gate and drain coupled to (N1);
an n-type fourteenth transistor having a source coupled to (VSS), a gate coupled to (N1), and a drain coupled to (CMFB);
a p-type fifteenth transistor having a source coupled to (VDD), a gate coupled to (BIASG), and a drain coupled to (CMFB); and
a p-type diode-connected sixteenth transistor having a source coupled to (VDD), and a gate and drain coupled to (CMFB), for the purposes of reducing an open-loop gain of a duty cycle control feedback loop.

11. The multi-phase clock generator circuit of claim 9, wherein the transistors to amplify a voltage difference of signals on internal nodes (AA) and (BB) and generate a voltage on (DCC) proportional to the voltage difference comprise:

a p-type seventeenth transistor having a source coupled to (VDD), a gate coupled to (BB), and a drain coupled to an internal node (N2);
a p-type eighteenth transistor having a source coupled to (N2), a gate coupled to (BIASG), and a drain coupled to an internal node (N4);
a p-type nineteenth transistor having a source coupled to (VDD), a gate coupled to (AA), and a drain coupled to an internal node (N3);
a p-type twentieth transistor having a source coupled to (N3), a gate coupled to (BIASG), and a drain coupled to (DCC);
an n-type twenty-first transistor having a source coupled to (VSS), and a gate and drain coupled to (N4); and
an n-type twenty-second transistor having a source coupled to (VSS), a gate coupled to (N4), and a drain coupled to (DCC).

12. The multi-phase clock generator circuit of claim 7, wherein the input level converter and duty cycle adjust circuit of the input clock signal conditioning circuit comprises:

the input terminal (IN);
the duty cycle control input terminal (DCC);
the output terminal (OUT);
power supply terminals (VSS) and (VDD);
a third power supply terminal (CTRL);
an n-type first transistor having a source coupled to (VSS), a gate coupled to (CTRL), and a drain coupled to an internal node (BIASP);
a p-type second transistor having a source coupled to an internal node (N1), a gate coupled to (VSS), and a drain coupled to an internal node (BIASP);
a p-type third transistor having a source coupled to (VDD), a gate coupled to (BIASP), and a drain coupled to (N1);
a p-type fourth transistor having a source coupled to (VDD), a gate coupled to (BIASP), and a drain coupled to an internal node (N2);
a p-type fifth transistor having a source coupled to (N2), a gate coupled to (IN), and a drain coupled to an internal node (/OUT);

an n-type sixth transistor having a gate coupled to (DCC), and a source and drain coupled to (VSS);

an n-type seventh transistor having a source coupled to (VSS), a gate coupled to (DCC), and a drain coupled to an internal node (N3);

an n-type eighth transistor having a source coupled to (N3), a gate coupled to (IN), and a drain coupled to (/OUT);

an n-type ninth transistor having a source coupled to (VSS), and a gate and drain coupled to (/OUT);

an n-type tenth transistor having a gate coupled to (/OUT), and a source and drain coupled to (VSS);

an n-type tenth transistor having a source coupled to (VSS), a gate coupled to (/OUT), and a drain coupled to (/OUT); and a p-type eleventh transistor having a source coupled to (CTRL), a gate coupled to (/OUT), and a drain coupled to (/OUT).

13. The multi-phase clock generator circuit of claim 7, wherein the phase detector comprises:

(CLK0), (CLK2), (CLK6), and (CLK8) clock input terminals that receive clock output signals of the delay stages of the (VCDL);

an output terminal (DELAY);

power supply terminals (VSS) and (VDD);

a first sampler circuit having an input terminal (DATA) coupled to (CLK0), an input terminal (CLK) coupled to (CLK8), an output terminal (Q) coupled to an internal node (N1), and (VSS) and (VDD) power supply terminals;

a second sampler circuit having an input terminal (DATA) coupled to (CLK6), an input terminal (CLK) coupled to (CLK0), an output terminal (Q) coupled to an internal node (N2), and (VSS) and (VDD) power supply terminals;

a third sampler circuit having an input terminal (DATA) coupled to (CLK2), an input terminal (CLK) coupled to (CLK8), an output terminal (Q) coupled to an internal node (N3), and (VSS) and (VDD) power supply terminals;

a first inverter having an input terminal (IN) coupled to (N3), an output terminal (DELAY) coupled to an internal node (N4), and (VSS) and (VDD) power supply terminals;

a 3-input (NAND) gate having an a first input terminal (IN0) coupled to (N1), a second input terminal (IN1) coupled to (N2), a third input terminal (IN2) coupled to (N4), and (VSS) and (VDD) power supply terminals;

a second inverter having an input terminal (IN) coupled to (N5), an output terminal (/DELAY) coupled to an internal node (N6), and (VSS) and (VDD) power supply terminals; and a third inverter having an input terminal (IN) coupled to (N6), an output terminal (/DELAY) coupled to (DELAY), and (VSS) and (VDD) power supply terminals.

14. The multi-phase clock generator circuit of claim 13, wherein each sampler circuit has substantially zero setup/hold time error and comprises:

a sampler input terminal (DATA);

a sampler input terminal (CLK);

power supply terminals (VSS) and (VDD);

a p-type first transistor having a source coupled to (VDD), a gate coupled to (DATA), and a drain coupled to an internal node (/RESET);

a p-type second transistor having a source coupled to (VDD), a gate coupled to (CLK), and a drain coupled to (/RESET);

a p-type third transistor having a source coupled to (VDD), a gate coupled to an internal node (/SET), and a drain coupled to (/RESET);

a p-type fourth transistor having a source coupled to (VDD), a gate coupled to (/RESET), and a drain coupled to (/SET);

a p-type fifth transistor having a source coupled to (VDD), a gate coupled to (CLK), and a drain coupled to (/SET);

a p-type sixth transistor having a source coupled to (VDD), a gate coupled to (DATA), and a drain coupled to (/SET);

a p-type seventh transistor having a source coupled to (VDD), a gate coupled to (CLK), and a drain coupled to an internal node (N1);

a p-type eighth transistor having a source coupled to (VDD), a gate coupled to (DATA), and a drain coupled to an internal node (N2);

an n-type ninth transistor having a source coupled to (N1), (a gate coupled to (/SET), and a drain coupled to (/RESET);

an n-type tenth transistor having a source coupled to (N2), a gate coupled to (/RESET), and a drain coupled to (/SET);

an n-type eleventh transistor having a source coupled to (VSS), a gate coupled to (CLK), and a drain coupled to (N1);

an n-type twelfth transistor having a source coupled to (VSS), a gate coupled to (DATA), and a drain coupled to (N2); and an RS-latch having a terminal (/SET) coupled to internal node (/SET), a terminal (/RESET) coupled to internal node (/RESET), and an output terminal (Q) coupled to an internal node (N3); and a (D) flip-flop having a terminal (D) coupled to (N3), a terminal (CLK) coupled to sampler terminal (CLK), and an output terminal (Q) coupled to sampler output terminal (Q), wherein a logic level at (Q) is updated in accordance with a logic level at (D) on a rising edge of (CLK).

15. The sampler circuit of claim 14, wherein the RS-latch comprises:

an input terminal (/SET);

an input terminal (/RESET);

an output terminal (Q);

power supply terminals (VSS) and (VDD);

a first inverter having an input terminal (IN) coupled to (/SET), an output terminal (/OUT) coupled to an internal node (SET), and (VSS) and (VDD) power supply terminals;

a second inverter having an input terminal (IN) coupled to (/RESET), an output terminal (/OUT) coupled to an internal node (RESET), and (VSS) and (VDD) power supply terminals;

a first NOR gate having a first input terminal (IN0) coupled to (Q), a second input terminal (IN1) coupled to (SET), and an output terminal (/OUT) coupled to an internal node (/Q); and a second NOR gate having a first input terminal (IN0) coupled to (/Q), a second input terminal (IN1) coupled to (RESET), and an output terminal (/OUT) coupled to (Q).

16. The multi-phase clock generator circuit of claim 15, wherein first, second, third, and fourth output clock signals are generated and the multi-stage voltage-controlled delay line comprises first, second, third, and fourth delay stages;

wherein the multi-phase clock generator circuit further comprises:

an input terminal (RESET);

a first transistor having a source coupled to (VSS), a gate coupled to (RESET), and a drain coupled to the output of the low-pass filter;
an inverter having an input terminal (IN) coupled to (RESET), and an output terminal (/OUT) coupled to an internal node (/RESET);
a p-type first transistor having a source coupled to (VDD), a gate coupled to (/RESET), and a drain coupled to the (CTRL) terminal of the first delay stage;
a p-type second transistor having a source coupled to (VDD), a gate coupled to (/RESET), and a drain coupled to the (CTRL) terminal of the second delay stage;
a p-type third transistor having a source coupled to (VDD), a gate coupled to (/RESET), and a drain coupled to the (CTRL) terminal of the third delay stage;
a p-type fourth transistor having a source coupled to (VDD), a gate coupled to (/RESET), and a drain coupled to the (CTRL) terminal of the fourth delay stage;
a first resistor coupled between the (CTRL) and (COMCTRL) terminals of the first delay stage;
a second resistor coupled between the (CTRL) and (COMCTRL) terminals of the second delay stage;
a third resistor coupled between the (CTRL) and (COMCTRL) terminals of the third delay stage; and
a fourth resistor coupled between the (CTRL) and (COMCTRL) terminals of the fourth delay stage; and further wherein,
the (IN) terminal of the first delay stage is coupled to the (OUT) terminal of the input clock signal conditioning circuit;
the (OUT) terminal of the first delay stage is coupled to the (IN) terminal of the second delay stage;
the (OUT) terminal of the second delay stage is coupled to the (IN) terminal of the third delay stage;
the (OUT) terminal of the third delay stage is coupled to the (IN) terminal of the fourth delay stage;
the (OUT) terminal of the fourth delay stage is coupled to the (FB) terminal of the input clock signal conditioning circuit;
the (CLKOUT) terminal of the first delay stage is coupled to a (CLK0) output terminal;
the (CLKOUT) terminal of the second delay stage is coupled to a (CLK2) output terminal;
the (CLKOUT) terminal of the third delay stage is coupled to a (CLK4) output terminal;
the (CLKOUT) terminal of the fourth delay stage is coupled to a (CLK6) output terminal;
the (CLKL) terminal of the first delay stage is coupled to the (CLK0) output terminal;
the (CLKT) terminal of the first delay stage is coupled to the (CLK2) output terminal;
the (CLKL) terminal of the second delay stage is coupled to the (CLK2) output terminal;
the (CLKT) terminal of the second delay stage is coupled to the (CLK4) output terminal;
the (CLKL) terminal of the third delay stage is coupled to (CLK4) output terminal;
the (CLKT) terminal of the third delay stage is coupled to the (CLK6) output terminal;
the (CLKL) terminal of the fourth delay stage is coupled to (CLK6) output terminal;
the (CLKT) terminal of the fourth delay stage is coupled to the (CLK0) output terminal;
the phase detector's (CLK0) clock input terminal is coupled to the (CLK0) output terminal;
the phase detector's (CLK2) clock input terminal is coupled to the (CLK2) output terminal;
the phase detector's (CLK6) clock input terminal is coupled to the (CLK6) output terminal;
the phase detector's (CLK8) clock input terminal is coupled to the internal node (CLK8) of the input clock signal conditioning circuit;
the (CTRL) terminal of the input level converter and duty cycle adjust circuit is coupled to the (CTRL) terminal of the first delay stage;
the (CTRL) terminal of the output level converter and buffer of the input clock signal conditioning circuit is coupled to the (CTRL) terminal of the fourth delay stage;
the (CTRL) terminal of the duty cycle measurement circuit is coupled to the (CTRL) terminal of the fourth delay stage;
all (CMFB) terminals are coupled together;
all (COMCTRL) terminals are coupled together;
all (BIASG) terminals are coupled together;
all (VSS) terminals are coupled together; and
all (VDD) terminals are coupled together.

17. A multi-phase clock generator circuit that generates a plurality of output clock signals having substantially equal phase spacing, comprising:
a clock input terminal that receives an input clock signal;
a voltage-controlled delay line (VCDL) having a plurality of successive delay stages, a first delay stage of the voltage-controlled delay line receiving the input clock signal and delaying it to produce a delayed clock signal, each next delay stage receiving the delayed clock signal from the previous delay stage and further delaying it, each delay stage of the voltage-controlled delay line producing an output clock signal based on a respective one of the input clock signal and delayed clock signals, and each delay stage of the voltage-controlled delay line comprising:
a phase measurement circuit that receives the output clock signal produced by that delay stage and the output clock signal produced by the next delay stage of the voltage-controlled delay line and that produces therefrom a measure of the phase spacing between the two received output clock signals;
first and second voltage-controlled current sources that receive the phase measurement from the phase measurement circuit and produce therefrom a control signal; and
a voltage-controlled delay element having an input that receives the input clock signal or delayed clock signal input to said delay stage and that, in response to the control signal from the voltage-controlled current sources, imposes an insertion delay on the input clock signal or delayed clock signal to said delay stage to produce the delayed clock signal for the delay stage, the delayed clock signal being fed to the next delay stage of the delay line;
a phase detector; and
a low-pass filter coupled between and operating in combination with the phase detector, the phase measurement circuits, and the first and second voltage-controlled current sources, to provide stable control of the insertion delay of each delay stage of the (VCDL) such that each insertion delay is substantially equal to the others and the phase spacing between adjacent output clock signals of the different delay stages is thereby substantially uniform.

18. The multi-phase clock generator circuit of claim 17, wherein the first voltage controlled current source of each delay stage provides a switched power supply current to the voltage-controlled delay element of that delay stage, with the switch position dependent on whether a last clock phase leads or lags a first clock phase, wherein the second voltage-controlled current source provides a current controlled at least in part by the phase measurement produced by the phase measurement of the delay stage, and wherein the currents provided by the first and second voltage controlled current sources are summed and integrated by a respective filter capacitor of the delay stage to produce said control signal that is input to the voltage-controlled delay element of the delay stage.

19. The multi-phase clock generator circuit of claim 17, wherein the phase detector operates to ensure that a total delay of the (VCDL) is substantially equal to the period of the input clock signal.

20. The multi-phase clock generator circuit of claim 17, wherein each delay stage of the (VCDL) further comprises an output level converter and buffer circuit that receives either the input clock signal or the delayed clock signal from the prior delay stage and that produces therefrom the respective output clock signal for that delay stage, each output level converter and buffer circuit comprising:
- a first set of transistors that minimize duty cycle distortion on the output clock signal; and
- a second set of transistors that form two series inverters that buffer the output clock signal and increase the output drive strength of the circuit.

* * * * *

UNITED STATES PATENT AND TRADEMARK OFFICE
CERTIFICATE OF CORRECTION

| | | |
|---|---|---|
| PATENT NO. | : 7,821,316 B2 | Page 1 of 1 |
| APPLICATION NO. | : 12/342857 | |
| DATED | : October 26, 2010 | |
| INVENTOR(S) | : Alan S. Fiedler | |

It is certified that error appears in the above-identified patent and that said Letters Patent is hereby corrected as shown below:

In column 11, line 47, in Claim 9, after "(BIASNA)" insert -- , --.

In column 13, line 42, in Claim 13, delete "(DELAY)" and insert -- (/DELAY) --, therefor.

In column 14, line 18, in Claim 14, before "gate" delete "(a" and insert -- a --, therefor.

Signed and Sealed this
First Day of February, 2011

David J. Kappos
*Director of the United States Patent and Trademark Office*